United States Patent
Masui et al.

(10) Patent No.: US 10,412,282 B2
(45) Date of Patent: Sep. 10, 2019

(54) CAMERA DEVICE

(71) Applicant: DENSO CORPORATION, Kariya, Aichi-pref. (JP)

(72) Inventors: Soji Masui, Kariya (JP); Yasuki Furutake, Kariya (JP); Daisuke Takama, Kariya (JP); Kazuma Yamaguchi, Kariya (JP); Takashi Aoki, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 58 days.

(21) Appl. No.: 15/448,236

(22) Filed: Mar. 2, 2017

(65) Prior Publication Data

US 2017/0257537 A1    Sep. 7, 2017

(30) Foreign Application Priority Data

Mar. 3, 2016    (JP) .................................. 2016-041184

(51) Int. Cl.
*H04N 5/225*    (2006.01)
*H05K 1/02*    (2006.01)
(Continued)

(52) U.S. Cl.
CPC ......... *H04N 5/2254* (2013.01); *H04N 5/2252* (2013.01); *H04N 5/2253* (2013.01);
(Continued)

(58) Field of Classification Search
CPC .. H04N 5/2254; H04N 5/2252; H04N 5/2253; H05K 1/181; H05K 1/056; H05K 1/0274; H05K 1/09; H05K 2201/10151
See application file for complete search history.

(56) References Cited

U.S. PATENT DOCUMENTS

2004/0061799 A1*  4/2004  Atarashi ................ G02B 7/022
                                                            348/340
2005/0161587 A1*  7/2005  Mihara ................ H01L 21/6835
                                                            250/214 R
(Continued)

FOREIGN PATENT DOCUMENTS

JP      2005-086659        3/2005
JP      2006-330121        12/2006
(Continued)

*Primary Examiner* — Timothy J Henn
(74) *Attorney, Agent, or Firm* — Knobbe, Martens, Olson & Bear, LLP

(57)    ABSTRACT

A camera device which includes a holder which retains an optical member therein and a circuit board on which an image sensor is mounted. The holder is joined to the circuit board using an adhesive agent. The circuit board at least partially includes a metallic layer and a resinous layer stacked in a thickness-wise direction of the circuit board. The circuit board has a metallic layer-absent portion in which the metallic layer is partially omitted. The metallic layer-absent portion is located so as to overlap the joint between the holder and the circuit board in the thickness-wise direction of the circuit board, thereby minimizing the transfer of heat of the adhesive agent to the metallic layer. This achieves effective hardening the adhesive agent, which will facilitate the ease with which the camera device is assembled.

10 Claims, 4 Drawing Sheets

(51) Int. Cl.
*H05K 1/05* (2006.01)
*H05K 1/09* (2006.01)
*H05K 1/18* (2006.01)

(52) U.S. Cl.
CPC ......... *H04N 5/2257* (2013.01); *H05K 1/0274* (2013.01); *H05K 1/056* (2013.01); *H05K 1/09* (2013.01); *H05K 1/181* (2013.01); *H05K 2201/10121* (2013.01); *H05K 2201/10151* (2013.01); *H05K 2201/2018* (2013.01); *Y02P 70/611* (2015.11)

(56) References Cited

U.S. PATENT DOCUMENTS

| | | |
|---|---|---|
| 2005/0169620 A1 | 8/2005 | Minamio et al. |
| 2011/0019077 A1 | 1/2011 | Kobayashi et al. |
| 2012/0205768 A1 | 8/2012 | Sugahara et al. |
| 2012/0257075 A1 | 10/2012 | Kamada |
| 2015/0077840 A1* | 3/2015 | Kim .................. G02B 7/08 359/355 |
| 2015/0215551 A1 | 7/2015 | Kamada |
| 2016/0004029 A1* | 1/2016 | Tun .................. G02B 7/025 359/819 |
| 2017/0257532 A1* | 9/2017 | Takama ............. H04N 5/2252 |
| 2017/0280558 A1* | 9/2017 | Ohara ................ H05K 1/0274 |
| 2018/0110124 A1* | 4/2018 | Shigemitsu .......... H05K 1/189 |

FOREIGN PATENT DOCUMENTS

| | | |
|---|---|---|
| JP | 2010-205773 | 9/2010 |
| JP | 2014-066921 | 4/2014 |
| JP | 2014-225777 | 12/2014 |
| JP | 2014-225777 A | 12/2014 |

* cited by examiner

CAMERA DEVICE

CROSS REFERENCE TO RELATED DOCUMENT

The present application claims the benefit of priority of Japanese Patent Application No. 2016-41184 filed on Mar. 3, 2016, the entire disclosure of which is incorporated herein by reference.

BACKGROUND

1 Technical Field

This disclosure relates generally to a camera device equipped with an image sensor and an optical member which directs light to the image sensor.

2 Background Art

The above type of camera device is known which is equipped with a lens as an optical member. The use of the lens, however, requires a means for ensuring an accurate positional relation between the lens and a circuit board on which an image sensor is mounted in order to capture clear or fine images. To this end, a positional relation between a holder in which the lens is retained and a circuit board on which the image sensor is mounted may be corrected by means of six-axis adjustment, after which the holder and the circuit board are joined using an adhesive agent.

Japanese Patent First Publication No. 2014-225777 proposes use of, as the above type of adhesive agent, a thermosetting resin (i.e., a thermosetting adhesive) which contains an epoxy resin as a chief material (which will also be referred to as an epoxy-based material) or an ultraviolet curable adhesive (i.e., an ultraviolet curable adhesive).

The use of the thermosetting adhesive or the ultraviolet curable adhesive to achieve attachment between the holder and the circuit board achieves quick hardening of the adhesive as compared with use of a drying curable adhesive, but however, it is desired to further accelerate hardening of the adhesive joining the holder and the circuit board.

SUMMARY

It is therefore an object to provide a camera device which is designed to achieve quick hardening of an adhesive agent for use in joining a holder which retains an optical member and a circuit board on which an image sensor is mounted and also easy to assemble.

According to one aspect of the disclosure, there is provided a camera device which comprises: (a) a circuit board which at least partially includes a resinous layer and a metallic layer stacked in a thickness-wise direction thereof; (b) an image sensor which is disposed on the circuit board; (c) an optical member which works to direct light to the image sensor; (d) a holder which holds the optical member; and (e) a thermosetting adhesive agent. The holder is joined to the circuit board by heating and hardening the adhesive agent during a production process of the camera device, thereby ensuring the stability in positional relation between the image sensor and the optical member.

Generally, metal is higher in thermal conductivity than resin. When the thermosetting adhesive agent is heated and hardened, the quantity of heat applied to the thermosetting adhesive agent will, thus, be partially absorbed by the metallic layer of the circuit board. In order to alleviate this problem, the camera device in this disclosure has the metallic layer-absent portion in which the metallic layer is partially omitted. The metallic layer-absent portion is located so as to overlap the joint between the holder and the circuit board in the thickness-wise direction of the circuit board, thereby minimizing the transfer of heat from the adhesive agent to the metallic layer. This achieves effective heating of the thermosetting adhesive agent to quickly harden it, which will facilitate the ease with which the camera device is assembled.

According to another aspect of this disclosure, there is provided a camera device which comprises: (a) a circuit board; (b) an image sensor which is disposed on the circuit board; (c) an optical member which works to direct light to the image sensor; (d) a holder which holds the optical member; and (e) a light curable adhesive agent which achieves a joint between the holder and the circuit board. The attachment of the holder to the circuit board is achieved by emitting light to the light curable adhesive agent to harden it, thereby ensuring the stability in a desired positional relation between the image sensor and the optical member.

The light curable adhesive agent is transparent, which enhances reach of light to the whole of the light curable adhesive agent as compared with a black colored light curable adhesive agent, thereby quickly hardening the light curable adhesive agent. This facilitates the ease with which the camera device is assembled.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENT

Embodiments of this disclosure will be described below with reference to the drawings.

First Embodiment

Figure 1:
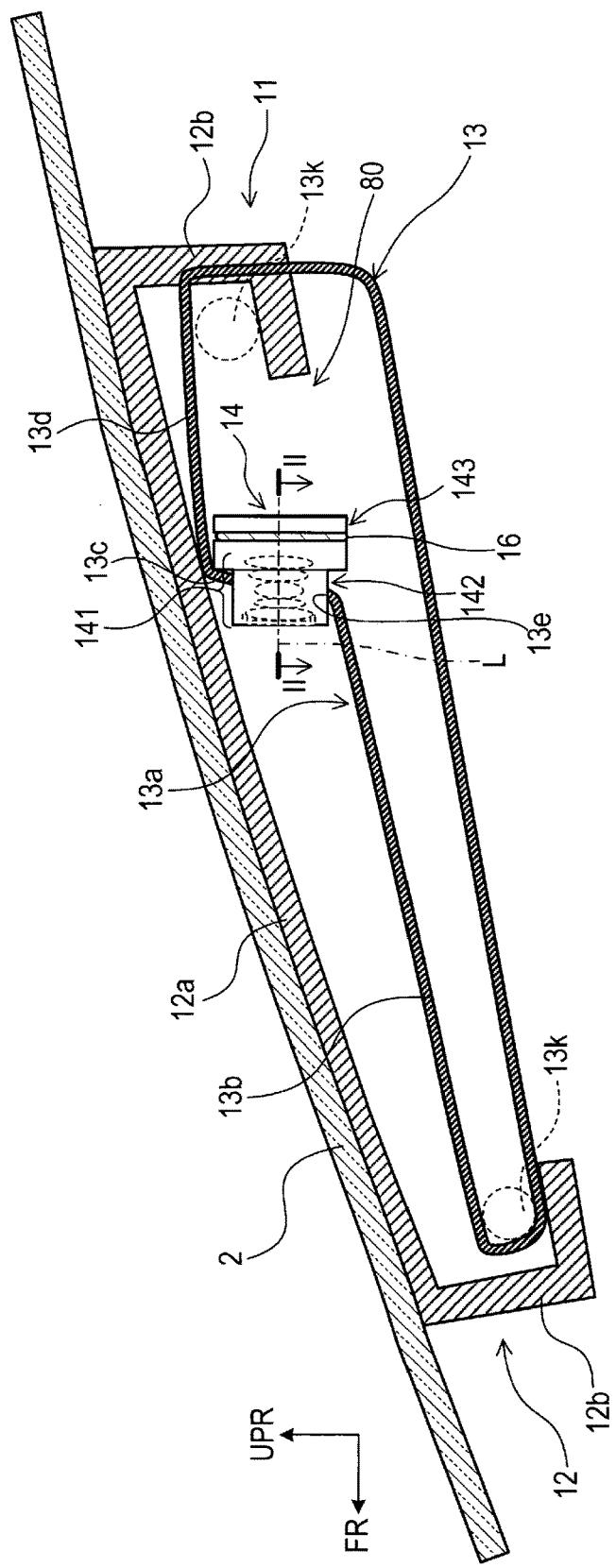
FIG. 1 is a longitudinal sectional view which illustrates a camera device according to the first embodiment.

Referring to FIG. 1, the camera device 11 is a so-called monocular camera and mounted on an inner surface of a front windshield 2 of a vehicle such as an automobile. For the sake of simplicity, FIG. 1 illustrates cross-sections of the front windshield 2 and the bracket 12 (which will be described later in detail) as viewed from the position of a plane through the L-shaped side plates 12b of the bracket 12. FIG. 1 also illustrates the case 13, as viewed from the position of a plane extending through an optical axis L of the camera module 14, and the camera module 14, as viewed from a side thereof. Like FIG. 1, each drawing, as will be referred to later, omits some parts of the camera device 11 for the simplicity of illustration.

In the following discussion, the front, rear, right, left, top, and bottom of each part of the camera device 11 are defined as those where the camera device 11 is, illustrated in FIG. 1, attached to the front windshield 2. In other words, the front of each part is oriented in a forward direction of the vehicle. In each drawing, "FR", "UPR", and "RH" represent front, upper, and rightward directions, respectively. These directions are, however, merely defined in this disclosure as expressing positional relation between each part of the camera device 11 for the sake of convenience. In practice, the orientation of the camera device 11 may be selected depending upon usage thereof. For instance, the camera device 11 may be secured to a portion of the vehicle other than the windshield 2 or mounted in or on objects other than vehicles. In this case, "UPR" does not always represent the vertical direction of the camera device 11 defined in relation to gravity.

The camera device 11 includes the bracket 12, the case 13, and the camera module 14. The bracket 12 is made of metal or resin and installed on the front windshield 2 within an occupant compartment of the vehicle. The installation, as referred to herein, contains positioning of the camera device 11. The camera device 11 may be detachably secured to a selected area of the front windshield 2. The bracket 12 includes the upper plate 12a glued to the front windshield 2 and four L-shaped side plates 12b extending downward from front, rear, right, and left sides of the upper plate 12a. The L-shaped side plates 12b each serve as a hook.

The case 13 is made from metal or resin in the form of a box and shaped to have an overall thickness decreasing in the forward direction. In other words, the case 13 has a volume decreasing in the forward direction. The case 13 has the upper surface 13a which is made up of the front flat surface 13b, the upright flat surface 13c, and the rear flat surface 13d.

The front flat surface 13b expands both in the longitudinal and lateral directions of the vehicle. The upright flat surface 13c extends upward from a rear end of the front flat surface 13b. The rear flat surface 13d extends backward from an upper end of the upright flat surface 13c. The upright flat surface 13c has formed in a central portion thereof the exposure hole 13e through which the front end of the camera module 14 is exposed outside the case 13. The exposure hole 13e is located intermediate between the front and rear ends of the upright flat surface 13c which are opposed to each other in the vertical direction and between the right and left ends of the upright flat surface 13c which are opposed to each other in the lateral direction.

The case 13 has near the upper surface 13a four cylindrical mounting bars 13k two of which protrude from the outer right side surface thereof (not shown) and two of which protrude from the outer left side surface thereof. For the sake of simplicity, FIG. 1 perspectively illustrates only two of the mounting bars 13k provided on the right side surface of the case 13. The fixing of the case 13 to the bracket 12 is achieved by hanging or placing the four mounting bars 13k on the four L-shaped side plates 12b of the bracket 12.

Figure 2:
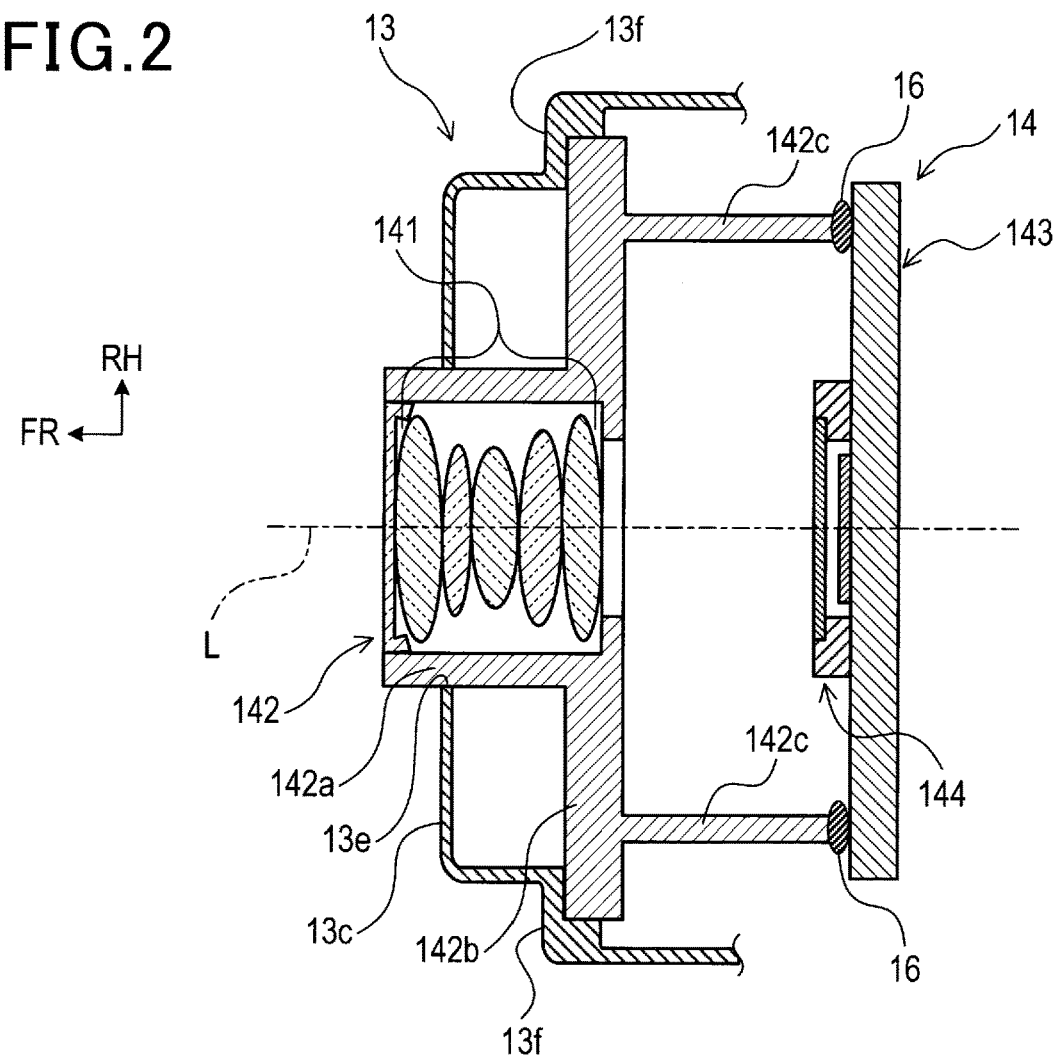
FIG. 2 is a sectional view, as taken along the line II-II in FIG. 1.

The camera module 14, as clearly illustrated in FIG. 2, includes a plurality of lenses 141, the holder 142, and the circuit board 143. The circuit board 143 is implemented by a known camera substrate. The holder 142 includes the hollow cylinder 142a which retains therein the lenses 141 arranged to have the optical axis L which is aligned with the center axis (i.e., the longitudinal center line) of the cylinder 142a. The holder 142 has the base plate 142b which is substantially rectangular in configuration and extends from a rear one of ends of the holder 142 which are opposed in an axial direction of the holder 142. The base plate 142b extends perpendicular to the longitudinal center line (i.e., the center axis) of the holder 142.

The upright flat surface 13c has outer shoulders 13f formed on right and left ends thereof. The shoulders 13f are defined by the recessed right and left ends of the upright flat surface 13c and located closer to the rear end of the case 13 than a central major part of the upright flat surface 13c with the exposure hole 13e is. The base plate 142b has a length extending in the lateral direction and is glued to the inner rear surface of the shoulders 13f of the case 13 using an adhesive agent not shown. In such attachment, the front surface of the base plate 142b is used as a positioning reference surface, thereby orienting or positioning the whole of the camera module 14 relative to the case 13. After the camera module 14 is positioned correctly in such a way, the outer periphery of the cylinder 142a is placed in contact with an inner periphery of the exposure hole 13e to minimize entrance of external light into the case 13. Although not illustrated, a signal processor substrate, not shown, which works to process an image signal captured by the camera module 14 and electrical conductors, not shown, connecting between the signal processor substrate and the circuit board 143 are disposed inside the case 13.

The base plate 142b has the hollow cylindrical holder leg 142c rearward extending from the rear surface which is on the opposite side of the base plate 142b to the cylinder 142a. The holder leg 142c is rectangular in transverse cross section thereof and formed integrally with the base plate 142b and the cylinder 142a. The holder leg 142c has the rear end surface 142d on the opposite side to the base plate 142b. The rear end surface 142d has, as indicated by a broken line in FIG. 4, a rectangular or square cross section.

The circuit board 143 is a plate-like substrate on which the image sensor 144 is mounted. The circuit board 143 is joined to the rear end of the holder leg 142c of the holder 142 using the adhesive agent 16. The adhesive agent 16 is implemented by a thermosetting epoxy adhesive.

The circuit board 143 has, as clearly illustrated in FIG. 3, a front surface (which will also be referred to below as a first surface) and a rear surface (which will also be referred to below as a second surface) opposed to each other through a thickness thereof and is made of a laminate or stack of the solder resist 143a, the metallic layer 143b, the resinous layer 143c, the metallic layer 143d, the resinous layer 143e, the metallic layer 143f, and the solder resist 143g which are arranged in this order in a thickness-wise direction of the circuit board 143. In other words, the circuit board 143 at least partially has a layer of the solder resist 143a, the metallic layer 143b, the resinous layer 143c, the metallic layer 143d, the resinous layer 143e, the metallic layer 143f, and the solder resist 143g which are stacked in the thickness-wise direction of the circuit board 143.

The solder resists 143a and 143g serve as protective layers. The metallic layers 143b, 143d, and 143f are made of an electrically conductive metallic thin layer. In this embodiment, the metallic layers 143b, 143d, and 143f are each made of copper foil. The resinous layers 143c and 143e are made of an electrically insulating resin layer. In this embodiment, the resinous layers 143c and 143e are each made from glass epoxy. Specifically, the circuit board 143 in this embodiment is formed by a four-layer glass epoxy board. The resinous layers 143c and 143e may be made from not only pure resin such as paper epoxy, but also glass epoxy resin that is a composite material containing glass fiber.

Figure 3:
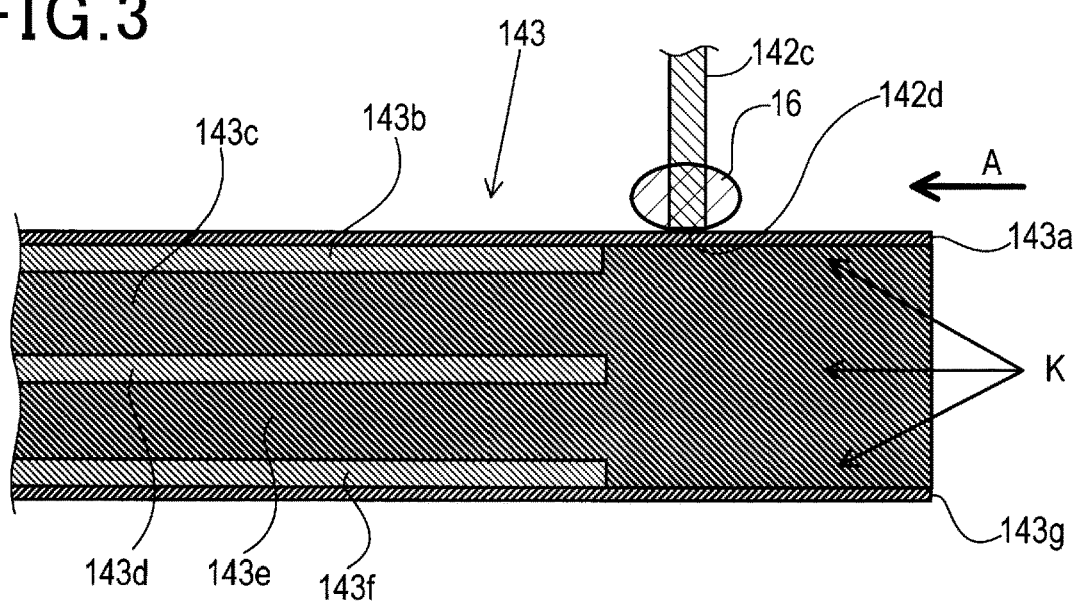
FIG. 3 is a partial sectional view which illustrates a region near an adhesive agent for use in joining a holder and a circuit board of a camera device illustrated in FIG. 2.
Figure 4:
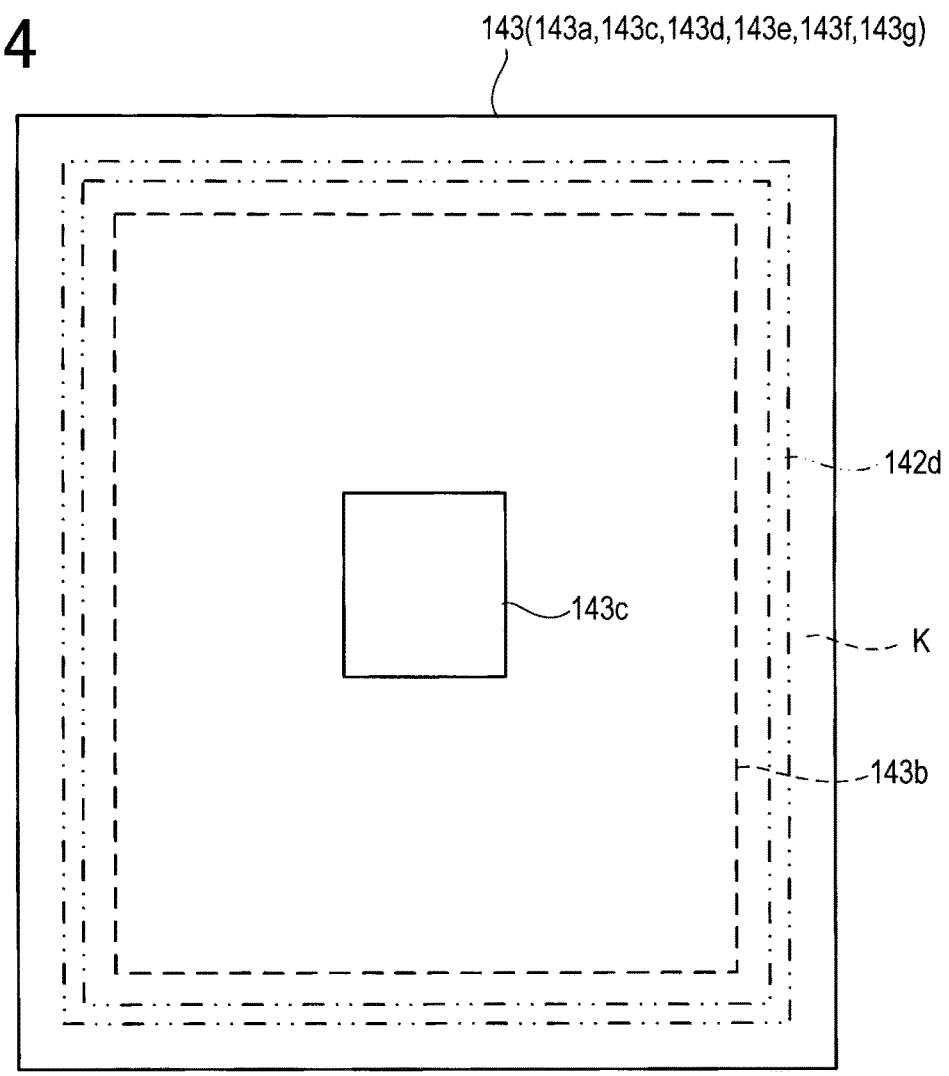
FIG. 4 is a front view which schematically illustrates a circuit board of the camera device of FIG. 1.

The circuit board 143 in this embodiment, unlike typical glass epoxy substrates, has metallic layer-absent portions K, as illustrated in FIGS. 3 and 4, formed in four sides of the circuit board 143. The metallic layer-absent portions K are made of a layer of resin in which the metallic layers 143b, 143d, and 143f are partly omitted. In other words, the resinous layers 143c and 143e are formed integrally with each other in a region where the metallic layer-absent portions K exist and extend to inner surfaces of the solder resists 143a and 143g. Each of the holder legs 142c is joined to the solder resist 143a using the adhesive agent 16 with the rear end surface 142 placed in contact with a corresponding portion of the solder resist 143a which is laid on the metallic layer-absent portions K. The image sensor 144 is, as can be seen in FIGS. 2 and 4, disposed on a front area of the circuit board 143 which is surrounded by the holder leg 142c.

Production processes of the thus constructed camera module 14 will be described below. First, the adhesive agent 16 is applied between the holder leg 142c and the circuit board 143. The positional relation between the lens 141 and the image sensor 144 is then corrected by means of six-axis adjustment. Specifically, a Cartesian coordinate system whose one of two coordinate lines (i.e., x- and y-axes) is the optical axis L is defined. Position misalignments of each of the holder 142 and the circuit board 143 from the x- and y-axes are corrected. Subsequently, a laser beam is, as indicated by an arrow A in FIG. 3, emitted along the front surface of the circuit board 143 from outside the circuit board 143 to harden the adhesive agent 16. The front surface of the circuit board 143 extends perpendicular to the thickness of the circuit board 143. Such thermal hardening does not completely harden the adhesive agent 16, but is a step called temporary hardening to temporarily fix the positional relation between the holder 142 and the circuit board 143, that is, between the lens 141 and the image sensor 144 in terms of the above described six axes. After the adhesive agent 16 is temporarily cured, the camera module 14 is put in a constant temperature bath to fully harden the adhesive agent 16.

The structure of the camera device 11 in the first embodiment offers the following advantages.

1a) The circuit board 143 is, as described above, equipped with the metallic layer-absent portions K in which the metallic layers 143b, 143d, and 143f are omitted. The metallic layer-absent portions K are located in alignment with joints of the holder 142 to the circuit board 143 through the adhesive agent 16 in the thickness-wise direction of the circuit board 143. In other words, the circuit board 143 has the metallic layer-absent portions K laid to overlap the joints of the holder 142 to the circuit board 143, as viewed in the thickness-wise direction of the circuit board 143. If the metallic layers 143b, 143d, and 143f which are higher in thermal conductivity are formed to fully extend in the circuit board 143 in a direction (i.e., a width-wise direction) perpendicular to the thickness-wise direction of the circuit board 143, it may cause heat generated by the laser beam applied to the adhesive agent 16 to be partially absorbed by the metallic layers 143b, 143d, and 143f. In order to eliminate such drawback, the circuit board 143 of this embodiment is designed to have metallic layer-absent portions K laid to overlap the adhesive agent 16 (i.e., the holder legs 142c) in the thickness-wise direction of the circuit board 143, thereby minimizing the transfer of heat of the adhesive agent 16 to the metallic layers 143b, 143d, and 143f. The structure of the camera device 11 of this embodiment is capable of effectively heating the thermosetting adhesive agent 16 and quickly hardening it, thereby facilitating the ease with which the camera device 11 is produced. Such a beneficial advantage may also be derived in a case where the adhesive agent 16 is hardened by hot air using a blower.

1b) The metallic layers 143b, 143d, and 143f used in the circuit board 143 may be made from various kinds of metal, but in this embodiment, they are made of copper foil which is known as being higher in thermal conductivity. The structure of the circuit board 143 equipped with the metallic layer-absent portions K is, therefore, very useful in minimizing the transfer of heat of the adhesive agent 16 to the metallic layers 143b, 143d, and 143f.

1c) An acrylic adhesive agent is known as being faster in hardening reaction than an epoxy adhesive agent, but greater in degree of deformation when being hardened. An acrylic adhesive agent after being fully hardened is also lower in mechanical strength than an epoxy adhesive agent. The adhesive agent 16 used in this embodiment is made of an epoxy adhesive which is smaller in degree of deformation when being hardened and higher in mechanical strength than the acrylic adhesive agent after being fully hardened. This ensures the stability in keeping a desired positional relation between the lens 141 and the image sensor 144 after being corrected by means of six-axis adjustment.

Second Embodiment

Figure 5:
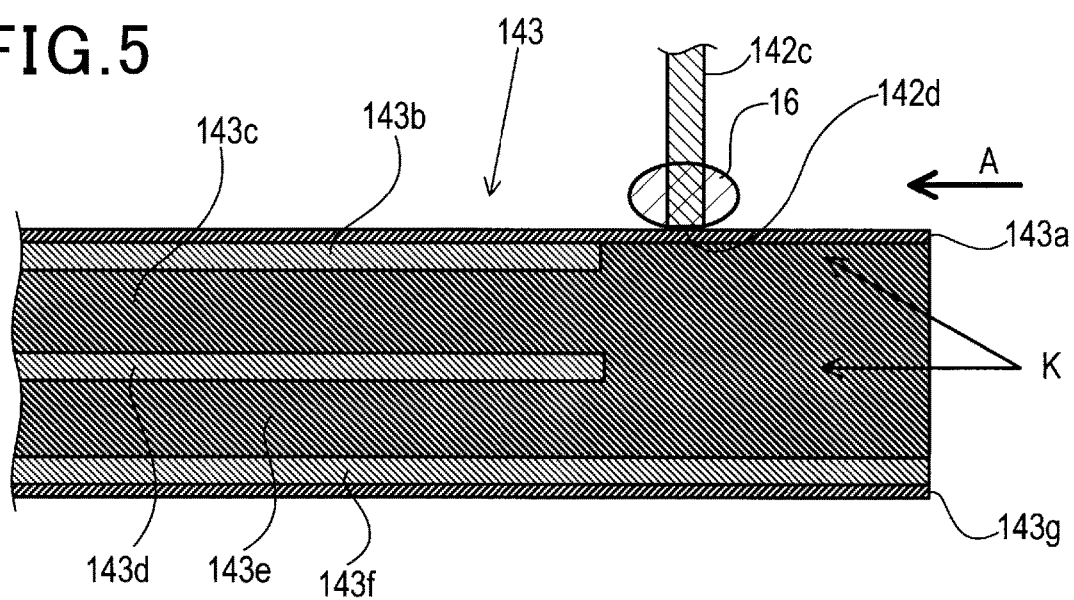
FIG. 5 is a partial sectional view which illustrates a region near an adhesive agent for use in joining a holder and a circuit board of a camera device according to the second embodiment.

The camera device 11 of the second embodiment will be described below with reference to FIG. 5. The same reference numbers as employed in the first embodiment will refer to the parts, and explanation thereof in detail will be omitted here.

The circuit board 143 of the first embodiment is equipped with the metallic layers 143b, 143d, and 143f each of which has the metallic layer-absent portion K, but, the circuit board 143 of the second embodiment does not have the metallic layer-absent portion K in the metallic layer 143f which is located farthest away from the adhesive agent 16, that is, does have the metallic layer-absent portions K only in the metallic layers 143b and 143d which are located closer to the adhesive agent 16 than the metallic layer 143f is. In other words, the metallic layer 143f extends fully in the circuit board 143 in a direction perpendicular to the thickness-wise direction of the circuit board 143.

The structure of the camera device 11 in the second embodiment offers the following advantages.

The closer to the adhesive agent 16 the metallic layers 143b, 143d, and 143f are located, the greater the quantity of heat of the adhesive agent 16 absorbed by the metallic layers 143b, 143d, and 143f. The metallic layer 143f which is farthest away from the adhesive agent 16 does not necessarily need to have the metallic layer-absent portion K in terms of the beneficial advantages as described in the first embodiment.

Third Embodiment

Figure 6:
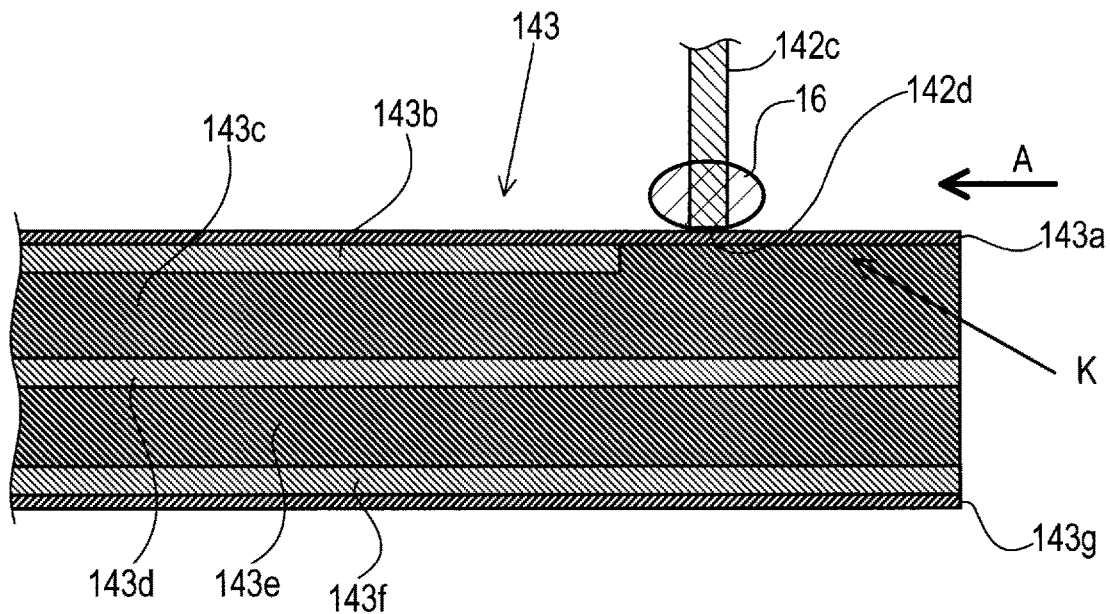
FIG. 6 is a partial sectional view which illustrates a region near an adhesive agent for use in joining a holder and a circuit board of a camera device according to the third embodiment.

The camera device 11 of the third embodiment will be described below with reference to FIG. 6. The same reference numbers as employed in the first embodiment will refer to the parts, and explanation thereof in detail will be omitted here.

The circuit board 143 of the first embodiment is equipped with the metallic layers 143b, 143d, and 143f each of which has the metallic layer-absent portion K, but, the circuit board 143 of the third embodiment has the metallic layer-absent portion K only in the metallic layer 143b which is the closest to the adhesive agent 16, that is, does not have the metallic layer-absent portions K in the metallic layers 143d and 143f which are located farther away from the adhesive agent 16 than the metallic layer 143b is. In other words, the metallic layers 143d and 143f extend fully in the circuit board 143 in a direction perpendicular to the thickness-wise direction of the circuit board 143.

The structure of the camera device 11 in the third embodiment offers the following advantages.

The closer to the adhesive agent 16 the metallic layers 143b, 143d, and 143f are located, the greater the quantity of heat of the adhesive agent 16 absorbed by the metallic layers 143b, 143d, and 143f. Only the metallic layer 143b which is the closest to the adhesive agent 16 may have the metallic layer-absent portion K in terms of the beneficial advantages as described in the first embodiment. The effect of quickly heating and then hardening the adhesive agent 16 is, however, the highest in the first embodiment, but the lowest in the third embodiment.

Fourth Embodiment

The camera device 11 of the fourth embodiment will be described below with reference to FIG. 7. The same reference numbers as employed in the first embodiment will refer to the parts, and explanation thereof in detail will be omitted here.

The circuit board 143 of the first embodiment is equipped with the metallic layers 143b, 143d, and 143f each of which has the metallic layer-absent portion K, but, the circuit board 143 of the fourth embodiment does not have the metallic layer-absent portion K at all in the metallic layers 143b, 143d and 143f. In other words, all the metallic layers 143b, 143d, and 143f extend fully in the circuit board 143 in a direction perpendicular to the thickness-wise direction of the circuit board 143. This embodiment uses an adhesive agent 216 instead of the thermosetting adhesive agent 16. The adhesive agent 216 is a transparent light curable adhesive. Specifically, the adhesive agent 216 is an epoxy ultraviolet curing adhesive and made transparent by emitting addition of a commonly used coloring agent thereto. The camera device 11 of this embodiment is different from that of the first embodiment only in this feature.

Figure 7:
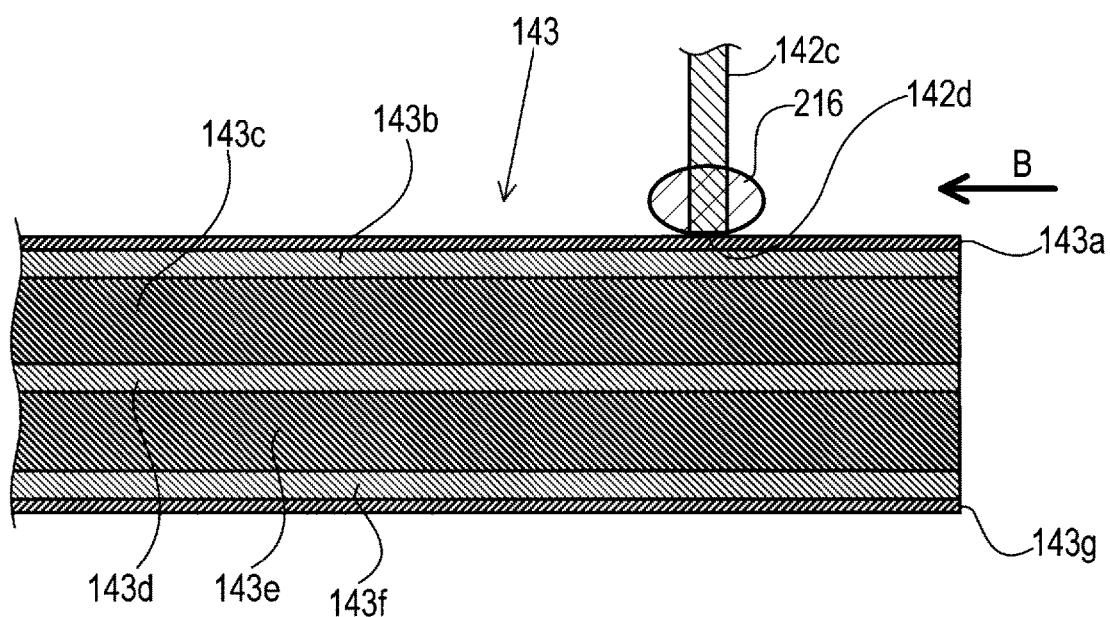
FIG. 7 is a partial sectional view which illustrates a region near an adhesive agent for use in joining a holder and a circuit board of a camera device according to the fourth embodiment.

In the fourth embodiment, after the positional relation between the lens 141 and the image sensor 144 is corrected by means of the six-axis adjustment, an ultraviolet beam is, as indicated by an arrow B in FIG. 7, emitted along the front surface of the circuit board 143 from outside the circuit board 143 to harden the adhesive agent 216. Such hardening does not completely harden the adhesive agent 216, but is a step called temporary hardening to temporarily fix the positional relation between the holder 142 and the circuit board 143, that is, between the lens 141 and the image sensor 144 in terms of the above described six axes.

The structure of the camera device 11 in the fourth embodiment offers the following advantages.

4a) A typical ultraviolet curing adhesive for use in temporarily fixing the holder 142 and the circuit board 143 is usually dyed black with carbon. The adhesive agent 216 used in the fourth embodiment is a transparent ultraviolet curing adhesive, thereby enhancing reach of an ultraviolet beam to the whole of the adhesive agent 216 as compared with when the adhesive agent 261 is colored black, which will quickly harden the adhesive agent 216 and facilitate the ease with which the camera device 11 is assembled. The beneficial effects, as offered by use of the transparent adhesive agent 216, are equally true for an adhesive agent which is hardened by light (e.g., visible light) instead of the ultraviolet light.

4b) If the adhesive agent 216 is colored black, it serves to avoid entry of outside light into the holder legs 142c, but however, the casing 13 of the camera device 11 is designed to shield against outside light. Specifically, the case 13 covers the image sensor 144, the circuit board 143, and the adhesive agent 16 or 216 to prevent light from reaching the image sensor 144 without passing through the lens 141, thus enabling the adhesive agent 216 to be made transparent without a risk of adverse effects of outside light on images captured by the image sensor 144.

4c) An acrylic adhesive agent is known as being faster in hardening reaction than an epoxy adhesive agent, but greater in degree of deformation when being hardened. An acrylic adhesive agent after fully hardened in a constant-temperature bath is also lower in mechanical strength than an epoxy adhesive agent. The adhesive agent 216 used in this embodiment is made of an epoxy adhesive which is smaller in degree of deformation when being hardened and higher in mechanical strength than the acrylic adhesive agent after being fully hardened. This ensures the stability in keeping a desired positional relation between the lens 141 and the image sensor 144 after corrected by means of six-axis adjustment.

"Transparent", as referred to in this disclosure, does not necessarily mean the fact that the light transmittance of the adhesive agent 261 is 100%. It is advisable that the light transmittance of the adhesive agent 261 be higher than that of commonly used adhesive agents. For instance, the adhesive agent 216 after being hardened may have a light transmittance which permits 50% or more of electromagnetic waves (i.e., light) whose wavelength is 200 nm to 400 nm to pass therethrough, more preferably, a light transmittance which permits 90% or more of electromagnetic waves whose wavelength is 200 nm to 400 nm to pass therethrough.

Modifications

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

5a) In each of the above embodiments, the adhesive agent 16 or 216 is an epoxy adhesive, but however, may alternatively be an acrylic adhesive or of another type. The adhesive agent 16 or 216 may also be an adhesive agent having both thermosetting and light curable properties. Such a hybrid adhesive agent is included in the adhesive agent 16 or 216.

5b) The positional relation between the lens 141 and the image sensor 144 is subjected to the six-axis adjustment in the above embodiments, but however, it may be corrected by means of four-axis adjustment. The camera device 11 may alternatively be designed to have an optical member, such as a filter, instead of the lens 141, which permits light to penetrate therethrough or reflects it toward the image sensor 144 using optical properties such as refraction, reflection, selective permeability, or optical rotation. The adjustment of the positional relation may be easily achieved depending upon the type of the optical member used.

5c) In each of the first to third embodiments, at least the metallic layer 143b of the circuit board 143 is shaped to have the metallic layer-absent portion K arranged to overlap the whole of a joint between the holder 142 (i.e., the holder leg 142c) and the circuit board 143 through the adhesive agent 16 in the thickness-wise direction of the circuit board 143, but however, the metallic layer-absent portion(s) K may be located so as to partially overlap the joint between the holder 142 and the circuit board 143 in the thickness-wise direction of the circuit board 143. For instance, when the metallic layer 143b is made of copper foil, holes may be drilled or punched at a regular interval away from each other in portions of the metallic layer 143b which overlap the above joints in the thickness-wise direction of the circuit board 143, and the metallic layer-absent portions K may be formed in the respective holes.

5d) In the fourth embodiment, the transparent adhesive agent 216 does not necessarily need to be applied to entire areas of the holder 142 (i.e., the holder leg 142c) and the circuit board 143 which are to be joined together, but however, a colored adhesive agent may instead be applied to only a portion(s) of the areas of the holder 142 and the circuit board 143 which are to be joined together.

5e) In the first to third embodiments, the circuit board 143 has the metallic layer-absent portion K at least in the metallic layer 143b, but however, may alternatively be designed to have the metallic layer-absent portion K only in the metallic layer 143f which is located farthest away from the joint between the holder 142 and the circuit board 143. This also reduces the quantity of heat of the adhesive agent 16 absorbed by the metallic layer 143f, thereby achieving quick hardening of the adhesive agent 16.

5f) The function or task of one of the above described components of the camera device 11 in the above embodiments may be shared with two or more of them. The tasks of two or more of the components of the camera device 11 may alternatively be allocated to one of the components. The components of the camera device 11 may be partly omitted. The component(s) of the camera device 11 in one of the embodiments or modifications may be added to another embodiment or modification or replaced with that of another embodiment or modification. Therefore, the invention should be understood to include all possible embodiments and modifications to the shown embodiments which can be embodied without departing from the principle of the invention as set forth in the appended claims.

What is claimed is:

1. A camera device comprising:
a circuit board which at least partially comprises a resinous layer and a metallic layer stacked in a thickness-wise direction thereof;
an image sensor which is disposed on the circuit board;
an optical member which works to direct light to said image sensor;
a holder which holds said optical member; and
a thermosetting adhesive agent which achieves a joint between said holder and said circuit board,
wherein said circuit board comprises a metallic layer-absent portion in which the metallic layer is partially omitted, the metallic layer-absent portion being located to overlap the joint in the thickness-wise direction of the circuit board,
wherein the metallic layer-absent portion is located in a region between opposing surfaces of the circuit board.

2. A camera device as set forth in claim 1, wherein said circuit board at least partially includes the resinous layer and a plurality of metallic layers stacked in the thickness-wise direction thereof, the resinous layer being disposed between two of the metallic layers, and wherein the metallic layer-absent portion is made by partially omitting one of the metallic layers which is located closest to the joint between the holder and the circuit board.

3. A camera device as set forth in claim 1, wherein said circuit board at least partially includes the resinous layer and a plurality of metallic layers stacked in the thickness-wise direction thereof, the resinous layer being disposed between two of the metallic layers, and wherein the metallic layer-absent portion is made by omitting a portion of each of the metallic layers which overlaps the joint between the holder and the circuit aboard in the thickness-wise direction.

4. A camera device as set forth in claim 1, wherein the metallic layer is made of copper foil.

5. A camera device as set forth in claim 1, wherein the thermosetting adhesive agent is an epoxy adhesive.

6. A camera device as set forth in claim 1, wherein the metallic layer-absent portion lies in a region of the circuit board defined around a line aligned with the joint and the circuit board in the thickness-wise direction, the line extending in a direction substantially perpendicular to a surface of the circuit, wherein the metallic layer is located outside the region in a direction perpendicular to the thickness-wise direction of the circuit board.

7. A camera device as set forth in claim 1, wherein the metallic layer is located at a predetermined distance from the joint in a direction perpendicular to the thickness-wise direction of the circuit board.

8. A camera device comprising:
a circuit board which at least partially comprises a resinous layer and a metallic layer stacked in a thickness-wise direction thereof;
an image sensor which is disposed on the circuit board;
an optical member which works to direct light to said image sensor;
a holder which holds said optical member; and
a thermosetting adhesive agent which achieves a joint between said holder and said circuit board,
wherein said circuit board comprises a metallic layer-absent portion in which the metallic layer is partially omitted, the metallic layer-absent portion being located to overlap the joint in the thickness-wise direction of the circuit board,
wherein the metallic layer-absent portion connects resinous layers in the thickness-wise direction.

9. A camera device comprising:
a circuit board which at least partially comprises a resinous layer and a metallic layer stacked in a thickness-wise direction thereof;
an image sensor which is disposed on the circuit board;
an optical member which works to direct light to said image sensor;
a holder which holds said optical member; and
a thermosetting adhesive agent which achieves a joint between said holder and said circuit board,
wherein said circuit board comprises a metallic layer-absent portion in which the metallic layer is partially omitted, the metallic layer-absent portion being located to overlap the joint in the thickness-wise direction of the circuit board, wherein a thickness of the resinous layer increases in the thickness-wise direction within the metallic layer-absent portion.

10. A camera device comprising:

a circuit board which at least partially comprises a resinous layer and a metallic layer stacked in a thickness-wise direction thereof;

an image sensor which is disposed on the circuit board;

an optical member which works to direct light to said image sensor;

a holder which holds said optical member; and a thermosetting adhesive agent which achieves a joint between said holder and said circuit board, wherein said circuit board comprises a metallic layer-absent portion in which the metallic layer is partially omitted, the metallic layer-absent portion being located to overlap the joint in the thickness-wise direction of the circuit board, wherein the metallic layer-absent portion comprises a portion of the circuit board in which at least a portion of the metallic layer is omitted from the metallic layer so as to not overlap the joint in the thickness-wise direction.

* * * * *